United States Patent [19]

Lindsey et al.

[11] 4,100,503
[45] Jul. 11, 1978

[54] CORRELATIVE TRACKING SYSTEM WITH LOCK INDICATOR

[75] Inventors: William C. Lindsey, Pasadena, Calif.; Heinrich Meyr, Hinterkappelen, Switzerland; Peter C. King, Ventura, Calif.

[73] Assignee: W. C. Lindsey Inc., Pasadena, Calif.

[21] Appl. No.: 707,285

[22] Filed: Jul. 21, 1976

[51] Int. Cl.² ............................................. H03B 3/04
[52] U.S. Cl. ................................. 331/1 A; 331/12; 331/25; 331/64
[58] Field of Search ................... 331/1 A, 10–12, 331/18, 25, 64

[56] References Cited

U.S. PATENT DOCUMENTS

| | | | |
|---|---|---|---|
| 3,801,925 | 4/1974 | Parkyn | 331/1 A |
| 3,909,735 | 9/1975 | Anderson et al. | 331/10 X |
| 3,956,710 | 5/1976 | Seitz et al. | 331/1 A |

Primary Examiner—Siegfried H. Grimm
Attorney, Agent, or Firm—James T. English

[57] ABSTRACT

Apparatus for indicating whether a correlation tracking system such as a phase-locked-loop has locked onto a periodic signal or not, utilizing a quadri-correlation circuit and digitalizers for the in-phase and the quadrature correlation signals, and logic circuitry for detecting the direction of transitions in the output state combinations of the digitalizers, and for adding the detector output signal rates for obtaining lock.

4 Claims, 6 Drawing Figures

CORRELATIVE TRACKING SYSTEM WITH LOCK INDICATOR

BACKGROUND OF THE INVENTION

1. Field of the invention

The present invention is related generally to correlative systems and more particularly, to a system and circuitry for indicating the state of the system; i.e., whether it is locked onto a periodic signal or not.

2. Description of the prior art

The prior art shows correlative tracking systems such as phase-locked-loops, wherein a quadrature correlation signal is used for lock indication by comparing it with a threshold value. In this device the definition of the locked state depends on the cut-off frequency, the characteristics of the low-pass filter, the lock detector circuit, on the amplitude of the input voltage, on the selected threshold, on the difference of the input frequency and the oscillator frequency, and on the phase relation of the two voltages. It is difficult to select the cut-off frequency of the low-pass filter and the threshold value so that indication of the locked state following acquisition and leaving the locked state is rapid and certain.

The U.S. Pat. No. 3,893,042 describes a lock indicator for phase-locked loops utilizing a second auxiliary phase-locked loop having a slightly different basic frequency to which the incoming signal is fed in parallel with the primary phase-locked loop. If the signal is acquired by both, an exclusive OR-gate produces a continuous zero output, indicating that a lock-up has occurred. For high background noise, no lock indication is given, even if the primary loop is still locked.

SUMMARY OF THE INVENTION

Briefly, the present invention converts the two analog output signals of a quadricorrelator into logic signals and by logic analysis of the sequence of signal changes detects the locked state and the sign of the difference of the input and oscillator frequencies.

OBJECTS OF THE INVENTION

It is an object of the present invention to remove phase lock indicator signal dependence on the amplitude of the input signal.

It is a further object of the present invention to generate a lock indicator signal wherein the signal values for the locked and out of lock states are easily and unambiguously distinguishable.

It is a further object of this invention to provide a lock indicator for a phase-locked loop, which, especially for low S/N ratios, gives a reliable lock indication.

It is more specifically an object of this invention to provide a signal for indication whether the actual oscillator frequency is higher or lower than the input frequency, and for automatically utilizing this signal during the acquisition mode of operation to extend the pull-in range of the loop.

Other objects, advantages and novel features of the present invention will become apparent from the following detailed description of the invention when considered in conjunction with the accompanying drawings wherein:

BRIEF DESCRIPTION OF THE DRAWINGS

Referring to FIG. 1 the input to a phase-locked loop known in the art is designated by 1. The basic loop consists of a correlator composed of a multiplier circuit 2 and a low-pass filter 3, the output of which is connected to the input of a voltage controlled oscillator 5 via a lead 4. The output of the oscillator 5 is connected via lead 6 to the second input of the multiplier 2.

Figure 1:
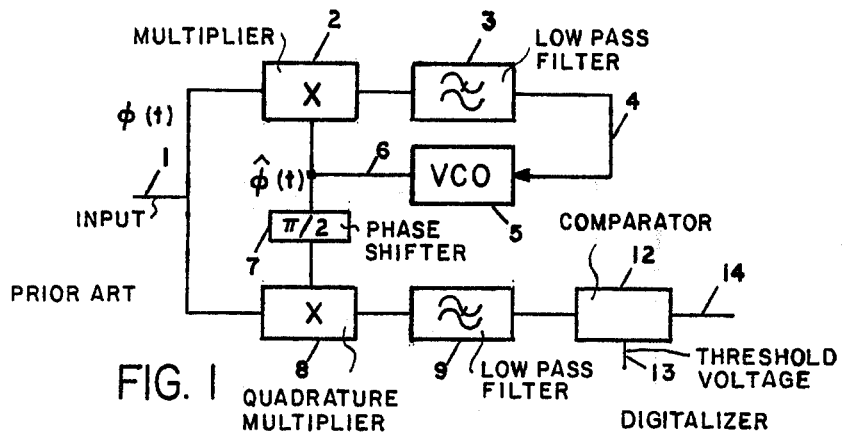
FIG. 1 shows a phase locked loop having a device known in the art for indicating the locked state.

In the locked state the oscillator frequency on line 6 is equal to the input frequency on line 1. However, there exists a phase difference producing an output voltage on line 4, which sets the frequency of oscillator 5 to said value. In the special case where the basic frequency of the oscillator, i.e., the frequency for the control voltage zero, is equal to the input frequency on line 1, the phase difference is exactly $\pi/2$, so that the voltage at the output of the correlator is equal to zero.

The second correlator serves for indicating the locked state of the loop. This second correlator consists of the phase shifting circuit 7, the multiplier circuit 8, and the low-pass filter 9. For the locked state the input voltages of the multiplier circuit 8 are approximately either in phase or in phase opposition, so that at its output a voltage of maximum value is generated, which is compared to a threshold voltage on line 13 by means of a comparator circuit 12. For voltages greater than the threshold value a signal is generated on line 14 indicating the locked state of the phase locked loop.

Figure 2:
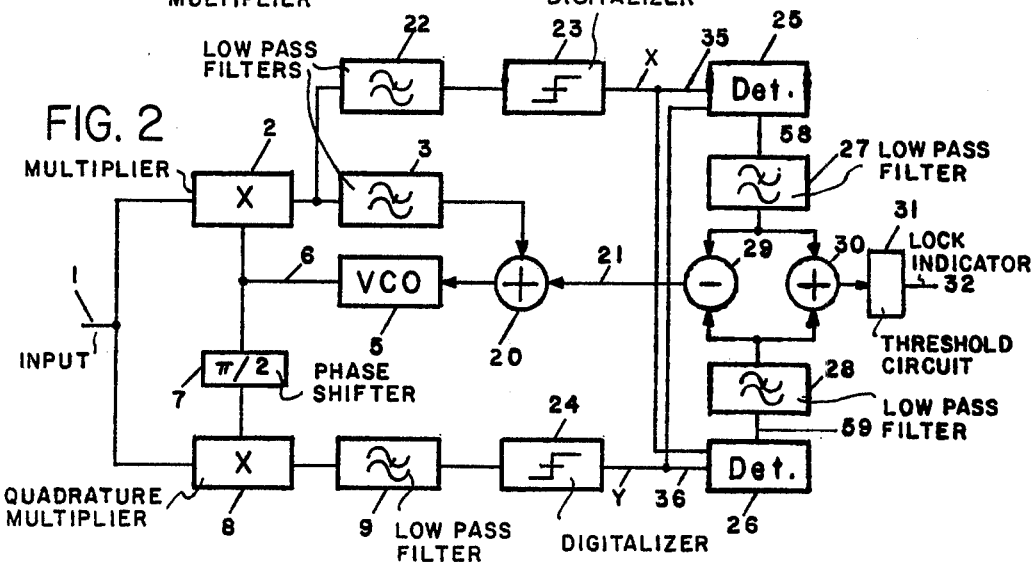
FIG. 2 shows a block diagram of the arrangement according to the invention.

FIG. 2 shows a block diagram of a circuit containing most of the items of FIG. 1, which are designated by the same numbers as in FIG. 1. An adder circuit 20 is inserted into the connection between the low-pass filter 3 and the voltage controlled oscillator 5. This adder has no effect as long as no voltage appears at its other input 21. Its operation will be described later.

As in FIG. 1, a correlator 7, 8, 9 serves for generating a quadrature correlation signal. Two digitalizers 23 and 24 are connected to the outputs of the multiplier circuits 2 and 8 via low-pass filters 22 and 9 respectively. The digitalizers generate the output state logic 1 for positive input voltages and the output state logic 0 for negative input voltages on line 35 and line 36 respectively. The transition from one output state to the other is preferably instantaneous.

The digitalizer 23 could be connected to the output of the low-pass filter 3 and the low-pass filter 22 could be omitted. However, it is an advantage to use a special low-pass filter 22 — as well as low-pass filter 9 — having a higher cut-off frequency than low-pass filter 3.

The combination of the output states $x$ of circuit 23, and the output states $y$ of circuit 24 can assume four values; i.e., $x, y = 00, 10, 11, 01$. These four values are shown as four corners of a square in a pointer diagram in FIG. 3. Switching from one state to the other always takes place along the sides of the square 50. The direction of the rotation around the square depends upon the difference of the input frequency on line 1 and the oscillator frequency on line 6. If the input frequency is for instance greater than the oscillator frequency the rotation of the pointer is clockwise; if it is smaller, the rotation would be counter-clockwise.

Two detectors 25 and 26 detect vector changes or complete revolutions (cycle slips) in one or the other direction respectively and deliver corresponding pulses. Low-pass filters 27, 28, filter out the double-frequency components and improve the signal-to-noise ratio as in the prior art. If the sum of the output pulse rates of the two detectors is higher than a predetermined threshold this indicates a non-locked state.

For determining this sum the mean value of the pulse rates at the outputs 58 and 59 of detectors 25 and 26 are filtered in low pass filters 27 and 28 to form mean signal outputs appearing at the inputs to summer 30 and differencing circuit 29. If the sum of these mean signal outputs is higher than a predetermined threshold, established in threshold circuit 31, a non-locked state is indicated at 32. If the sum of these mean signal outputs appearing at the input to 31 is below the threshold value, a locked indication appears at 32. The detectors 25 and 26 comprise counters illustrated in FIG. 5 and will be described in relation to that figure.

A subtraction circuit 29 continuously calculates the difference of the mean values of the output signals of low pass filters 27 and 28. This difference via line 21, is fed to the adder circuit 20 and serves in a known manner for supporting lock acquisition.

The range of operation is very large because the signal delivered by the subtraction circuit is proportional to the frequency difference of the oscillator voltage and the input voltage, and this with the correct sign in the entire passband of the low-pass filters 9 and 22.

The adder and subtraction circuits can also be connected directly to the outputs 58 and 59 of the detectors, which presents no difficulty because the output pulses of the two detectors do not appear simultaneously.

Figure 4:
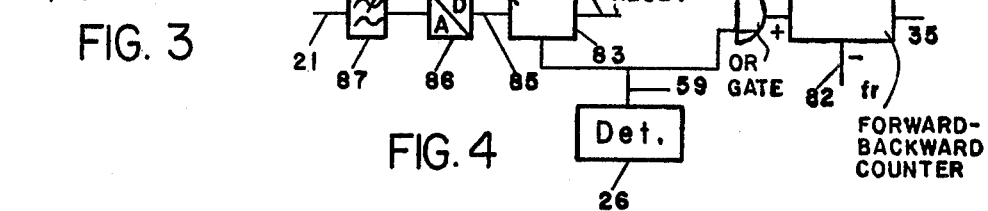
FIG. 4 shows another output circuit for FIG. 2.

Such a circuit is shown in FIG. 4, in which 25 and 26 represent the two detectors, whose outputs 58 and 59 are connected via an OR-gate 80 to the forward input of a forward-backward counter 81. This counter has a limited counting range and stops at its upper and lower counting limits until a pulse is received for counting in the opposite direction. The backward counting input 82 of the counter is connected to a clock delivering a reference frequency. The counter goes to one or the other end position according to which of the two frequencies is higher. If the counter is on its upper end position the pulse rate coming from the OR-gate 80 is higher than the predetermined value, indicating that the loop is not locked. Number 83 is another forward and backward counter with a forward input connected to the output 58 and the backward input connected to the output 59 and a reset input connected to line 84. This counter has also a limited counting range and is reset by periodic pulses on line 84. A digital to analog converter 86 and a low-pass filter 87 are connected to the output 85 of the counter. The output of the converter is connected by a line 21 to the analog addition circuit 20. On line 21 a voltage appears, which is proportional to the difference of the pulse rates delivered by the two detectors.

If this circuit is out of lock alternating voltages are generated at the outputs of the multiplier circuits; the frequencies of these voltages are equal to the difference of the input frequency and the oscillator frequency. If this difference exceeds the cut-off frequency of the low-pass filters 9 and 22 there appear no voltages at the outputs of the low-pass filters and the oscillator oscillates at its basic frequency.

If the signal to noise ratio of the input is very low, voltages appear at the output of the low-pass filters, produced by the noise voltage. If these voltages at the inputs of the digitalizers 23 and 24 exceed their threshold values, the pointer of the combination signal $x$, $y$ assumes the four corner positions of the square 50 in a random manner. No signal is generated at the output of the subtraction circuit 29, but a signal appears at the output of the adder circuit 30 which indicates that the locked state of the circuit is disturbed.

If the difference between the input frequency and the basic oscillator frequency is high and the noise voltage at the input 1 is so small that the threshold voltages of the circuit 23 and 24 are not reached, $x$ and $y$ remain constant and a locked state may be assumed erroneously. In this case the two states: frequency difference zero (locked) and frequency difference very high a circuit 12 according to FIG. 1 connected to the output of the low-pass filter 9 may be used. This circuit however, does not serve as indicator for the loss of the locked state.

The digitalizers 23 and 24 can be Schmitt triggers having transition points near zero input voltage. The loops may consist wholly of digital circuits. In this case the digitalizers are replaced by simple sign extractors.

Figure 5:
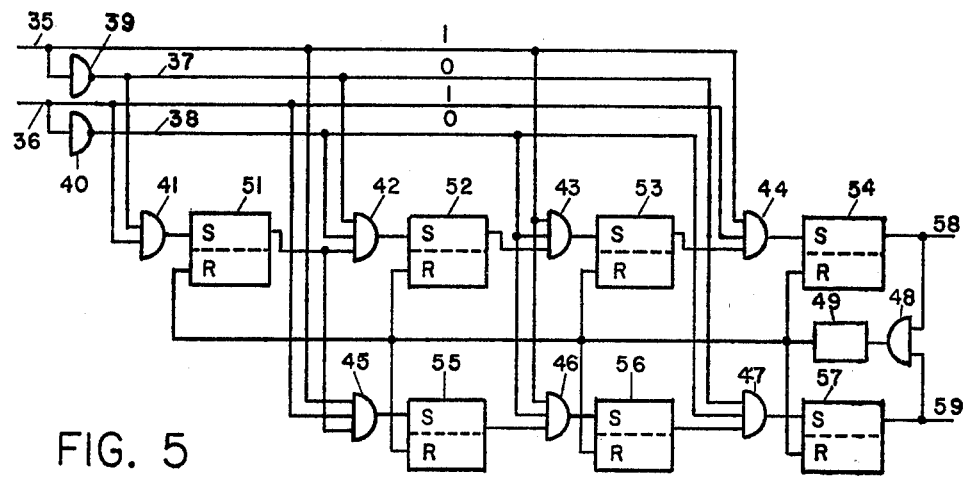
FIG. 5 shows a detector circuit for complete cycle slips, and FIG. 6 another detector circuit for single phase steps.

FIG. 5 shows an example for two counter circuits operating as detectors 25 and 26. The inputs of these counters are connected to lines 35; and 36. Two inverters 39 and 40 are connected each to one input and feed the lines 37 and 38. The counter 25 consists of four set-reset flip-flops 51 through 54 connected in series. Their set inputs are connected to the outputs of the AND-gates 41 through 44. In a similar manner the counter 26 consists of the set-reset flip-flops 51 and 55 through 57; their set inputs are connected to the outputs of the AND-gates 41 and 45 through 47. The flip-flop 51 is a part of both counters. The input of each AND-gate is connected to two of the lines 35 to 38, a further input of the AND-gates 42 through 47 is connected with the output of the preceding flip-flop. Both counter outputs 58 and 59 are connected to the reset inputs of all flip-flops via an OR-gate 48 and a delay circuit 49, so that they are reset as soon as an output signal of any counter appears.

If the sequence $x$, $y$ = 00 10, 11 01 appears, the flip-flop 51, 52 53 and 54 are set one after the other and an output signal appears on line 58. If the sequence $x$, $y$ is equal to 00 01, 11 10, the same happens for the flip-flops 51, 55 56 and 57, and an output signal appears on line 59. Thus the device counts the number of complete revolutions according to FIG. 3, in one or the other direction, beginning with the position 01 corresponding to the locked state.

Figure 3:
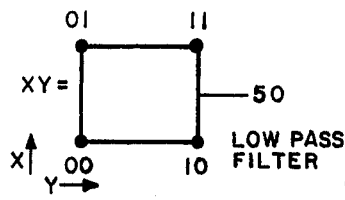
FIG. 3 is a pointer diagram of the digitalized output states of two correlators.

Instead of counting complete cycles of the vector according to FIG. 3, every single step in one or the other sense may be detected.

Figure 6:
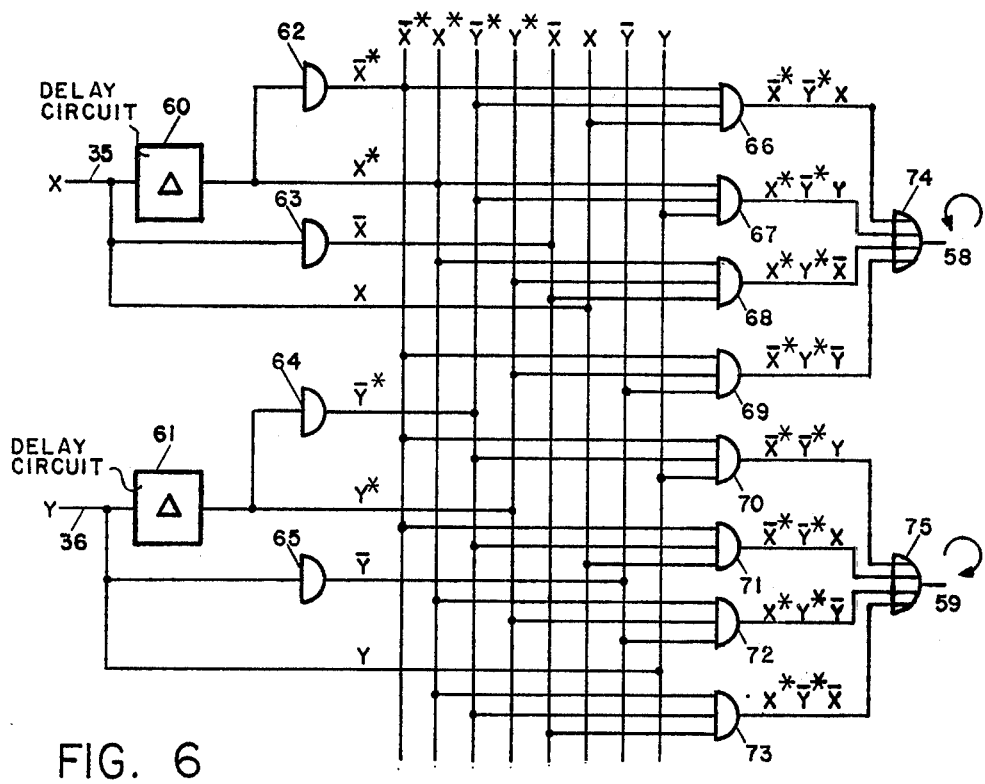

A circuit adapted for this purpose is shown in FIG. 6. Its two inputs are connected by lines 35 and 36 to the outputs of the digitalizers 23 and 24 according to FIG. 2. By means of the delay circuits 60 and 61 the signals $x^*$ and $y^*$ are generated from the signals $x$ and $y$. Four inverters 62 to 65 generate four inverted signals $\bar{x}$, $\bar{x}^*$, $\bar{y}$ and $\bar{y}^*$. These eight signals go to the inputs of eight gates 66 through 73; the pulses appearing at their outputs have a duration equal to the delay caused by the delay circuits 60 and 61. Each of these pulses corresponds to one of the eight possible transitions of the vector according to FIG. 3 from one state to a neighboring state. A pulse at the output of gate 66 for instance is generated when the vector changes from state 00 to state 10. In this case, the output of AND gate 66 would go high causing the output of OR gate 74 to go high, indicating on line 58 that a sequence transition has been made in a counterclockwise direction around the vector diagram of FIG. 3. Similarly, a transition from 00 to 01 causes gate 70 to go high producing an output on line 59 indicating a transition in the clockwise direction.

The outputs of the four gates 66 to 69 are combined in an OR-gate 74, the outputs of the four gates 70 to 73 in an OR-gate 75. Therefore an output pulse at the gate 75 indicates a clockwise transition of the vector, an output pulse at gate 74, a transition in the opposite sense.

What is claimed is:

1. In a correlative tracking system having an in-phase phase locked loop including a multiplier, a low pass filter and a VCO having an output signal, said multiplier having a carrier signal input and said VCO output signal as an input, said multiplier having a positive or a negative output signal proportional to in-phase or out-of-phase phase difference between said carrier signal and said VCO output signal, said correlative tracking system also having a quadrature multiplier having an input receiving said carrier signal and an input receiving a $\pi/2$ phase shifted replica of said VCO output signal, said quadrature multiplier having a positive or negative output proportional to in-phase or out-of-phase phase difference between said carrier signal and said phase shifted replica of said VCO output signal, said quadrature multiplier connected to a quadrature low-pass filter having an output indicating the locked status of said in-phase phase locked loop by comparison with a threshold, the improvement which comprises:

a first low pass filter having an input connected to said in-phase phase locked loop multiplier output, said low pass filter having an output;

a first digitizing means having an input connected to said first low pass filter output, said first digitizing means adapted to produce a positive pulse corresponding to $x=1$ or a negative pulse corresponding to $x=0$ when said output of said in-phase phase locked loop multiplier shifts positive or negative;

a second digitizing means having an input connected to said quadrature low pass filter output, said second digitizing means adapted to produce a positive pulse corresponding to $y=1$, or a negative pulse corresponding to $y=0$, when said quadrature multiplier output shifts positive or negative;

first detector means receiving positive and negative pulses corresponding to $x, y=00, 10, 11, 01$, produced by said first and second digitizing means, said first detector means having at least one output pulse when said positive and negative pulses corresponding to $x, y=00, 10, 11, 01$, have been received;

a second low pass filter receiving said output pulse of said first detector means, said second low pass filter having an output;

a second detector means receiving the reverse order of said positive and negative pulses, corresponding to $x, y=00, 01, 11, 10$, produced by said first and second digitizing means, said second detector means having at least one output pulse when the reverse order of said positive and negative pulses, corresponding to $x, y=00, 01, 11, 10$, has been received;

a third low pass filter connected to said output of said second detector means, said third low pass filter having an output;

a first adder connected to said second and said third low pass filter outputs, said first adder adapted to sum a plurality of pulses received from said second and said third low pass filter outputs, said first adder having an output signal proportional to said sum;

a comparator having an input connected to said first adder output, said comparator adapted to compare said sum with a threshold and to produce a signal when said threshold is exceeded, indicating an out of lock status;

differencing means connected to said second and third low pass filter outputs, said differencing means adapted to subtract the number of pulses received from said second low pass filter output from pulses received from said third low pass filter output, said differencing means having an output proportional to said difference; and a second adder having a first input connected to said in-phase phase locked loop low pass filter output, a second input connected to said differencing means, and an output connected to said VCO, said second adder adapted to algebraically add said signal proportional to said difference from said differencing means, to said phase locked loop low pass filter output, to control said VCO.

2. An improved correlative tracking system with lock indicator as described in claim 1 wherein said first and second detector means in combination comprise:

a first counter delivering a first output pulse after receiving a series of four pulses corresponding to $x=0, 0, 1, 1$, from said first digitizing means, coincidentally with four pulses corresponding to $y=0, 1, 1, 0$, from said second digitizing means;

a second counter delivering a second output pulse after receiving a series of four pulses corresponding to $x=0, 1, 1, 0$, from said first digitizing means coincidentally with four pulses corresponding to $y=0, 0, 1, 1$, from said second digitizing means, and means for resetting said first and second counters when said first output pulse or said second output pulse occurs.

3. A correlative tracking system with lock indicator as described in claim 1 wherein said first and said second detector means in combination comprise:

an $x$ input connected to said first digitizing means;

a first inverter connected to said $x$ input, and having an output $x$;

a first delay circuit connected to said $x$ input, said first delay circuit having an output $x^*$;

a third inverter having an input connected to said output $x^*$ of said first delay circuit, said third inverter having an output $x^*$;

a $y$ input connected to said second digitizing means;

a second inverter having an input connected to said $y$ input, and having an output $y$;

a second delay circuit having an input connected to said $y$ input, said second delay circuit having an output $y^*$;

a fourth inverter having an input connected to said output of said second delay circuit, said fourth inverter having an output $y^*$;

a first AND gate having a first input connected to said $x$ input, a second input connected to said third inverter output $\bar{x}^*$, and a third input connected to said fourth inverter output $\bar{y}^*$, said first AND gate having an output;

a second AND gate having a first input connected to said first delay circuit output $x^*$, a second input connected to said fourth inverter $\bar{y}^*$, and a third input connected to said $y$ input, said second AND gate having an output;

a third AND gate having a first input connected to said first delay circuit output $x^*$, a second input connected to said second delay circuit output $y^*$, and a third input connected to said first inverter output $\bar{x}$, said third AND gate having an output;

a fourth AND gate having a first input connected to said third inverter output $\bar{x}^*$, a second input connected to said second delay circuit output $y^*$, and a third input connected to said second inverter output $\bar{y}$, said fourth AND gate having an output;

a first OR gate having a first input connected to said output of said first AND gate, a second input connected to said output of said second AND gate, a third input connected to said output of said third AND gate, and a fourth input connected to said output of said fourth AND gate, said first OR gate having an output responsive to said first input of said second input or said third input or said fourth input;

a fifth AND gate having a first input connected to said third inverter output $\bar{x}^*$, a second input connected to said fourth inverter output $\bar{y}^*$, and a third input connected to said $y$ input, said fifth AND gate having an output;

a sixth AND gate having a first input connected to said third inverter output $\bar{x}^*$, a second input connected to said fourth inverter output $\bar{y}^*$, and a third input connected to said $x$ input, said sixth AND gate having an output;

a seventh AND gate having a first input connected to said first delay circuit output $x^*$, a second input connected to said second delay circuit output $y^*$, and a third input connected to said second inverter output $\bar{y}$, said seventh AND gate having an output;

an eighth AND gate having a first input connected to said first delay circuit output $x^*$, a second input connected to said fourth inverter output $\bar{y}^*$, a third input connected to said first inverter output $\bar{x}$, said eighth AND gate having an output; and a second OR gate having a first input connected to said fifth AND gate output, a second input connected to said sixth AND gate output, a third input connected to said seventh AND gate output, and a fourth input connected to said eighth AND gate output, said second OR gate having an output responsive to said first input or said second input or said third input or said fourth input.

4. A correlative tracking system as described in claim 1 wherein said first adder and said differencing means in combination comprise:

an OR gate as inputs pulses from said first and second detector means, said OR gate having an output when one or the other said first or second detector means produces one of said pulses;

a first forward-backward counter having a forward count input connected to said OR gate at said output, said forward-backward counter also having a backward counting input connected to a clock frequency source, said forward-backward counter having an output;

a second forward-backward counter having as forward inputs said pulses from said first detector means, and having as backward counting inputs said pulses from said second detector means, said second forward-backward counter having an output and a reset input;

a reset means connected to said reset input, adapted to return the count of said second forward-backward counter to zero periodically;

a digital to analog converter connected to said second forward-backward counter output, said converter adapted to convert digital counts of said second forward-backward counter to an analog voltage; and a low-pass filter having an input connected to said digital to analog converter and having an output connected to said second adder at said second input.

* * * * *